United States Patent [19]

Gingrich

[11] 4,368,501

[45] Jan. 11, 1983

[54] CONTROL OF ELECTRO-MAGNETIC SOLENOID

[75] Inventor: John A. Gingrich, Toronto, Canada

[73] Assignee: Dover Corporation, New York, N.Y.

[21] Appl. No.: 191,128

[22] Filed: Sep. 26, 1980

[51] Int. Cl.[3] .......................................... H01H 47/32
[52] U.S. Cl. .................................. 361/152; 187/29 R
[58] Field of Search ............... 361/152, 154, 159, 160; 187/2.9 R

[56] References Cited

U.S. PATENT DOCUMENTS 3,486,101 12/1969 Rufli ............................. 187/29 R X
3,614,996 10/1971 Saito et al. ......................... 187/29 R
3,671,814 6/1972 Dick .................................... 361/154

Primary Examiner—Harry E. Moose, Jr.
Attorney, Agent, or Firm—Brumbaugh, Graves, Donohue & Raymond

[57] ABSTRACT

An arrangement for controlling the rate of motion of a plunger of a D.C. electro-magnetic solenoid employs a solid state switching device connected in series with the primary winding of the solenoid. The rate of change of the flux in the primary winding induces a voltage in a sensing winding, which voltage is integrated and used to control the "on" time of the switching device so as to control the flux in the main coil.

9 Claims, 2 Drawing Figures

FIG. I

CONTROL OF ELECTRO-MAGNETIC SOLENOID

BACKGROUND OF THE INVENTION

This invention relates to a circuit for electronically controlling the rate of activation of an electromagnetic solenoid and, more particularly, the control of the release of an elevator brake.

While this invention is primarily intended for, and has been developed for use with an elevator brake magnet, its principles are not limited to elevators. As will be understood from the discussion below, this invention has general applicability wherever it is necessary to obtain smooth motion from a direct current electromagnet.

An elevator brake is applied by springs which force the brake shoes against the brake drum or disc to prevent rotation of the hoist motor. The brake shoes, which are attached to a plunger influenced by an electro-magnet, are moved away from the drum or disc by the energization of the brake electro-magnet, when it is required that the hoist motor rotate. Although some slow speed elevator systems depend entirely on the brake for stopping the elevator at each normal stop, most systems use the brake only as a holding brake and occasionally as an emergency stop. The present state of the art is such that the hoist motor can be brought to a complete stand still, regardless of the load on the car, prior to the de-energization of the magnet that causes the application of the brake. Thus it is not necessary to be concerned with the smoothness of the application of the brake, because it has no effect on the smoothness of the final stop as experiencd by a passenger in the elevator car. The same cannot be said of the release of the brake when the car is about to start. Although smooth starting performance is usually obtained with ease when the weight of the car plus its load equals the weight of the counterweight, considerable difficulty can be experienced at other loads. The situation is somewhat equivalent to starting an automobile on a hill, i.e. release of the brake may allow the car to move even before the motor is started.

The most obvious method to overcome the difficulty of achieving smooth starting performance is to measure the load in the car while the doors are closing in preparation for a trip. Then, the motor torque can be caused to assume an appropriate value such that the hoist motor will not move when the brake lifts. Once the brake has been lifted, the start can proceed normally with performance identical to a start at balanced load. This method has disadvantages, however. Accurate measurement of the load is difficult. If the motor torque is brought up to the appropriate level while the doors are closing, there is a potential hazard because faulty operation of this system might apply sufficient torque to rotate the motor in spite of the brake. There must of course be some feedback signal related to the measurement of torque, which might consist of a measurement of the armature current of a D.C. motor, and failure of this feed-back signal could permit maximum torque to be applied. Further, if the motor torque is brought up to the appropriate level only after the doors are fully closed, the start may have to be delayed by a noticeable amount, thereby reducing the performance of the elevator.

Another method for improving the smoothness of starting is to use a very special design for the brake electro-magnet. Experience has shown that extreme smoothness in the motion of the brake shoes under the influence of the magnet is required to get a smooth start. Any sudden change in the braking force, when there is motor torque or a weight unbalance trying to rotate the motor, results in a rough start that is noticeable to a passenger in the car. Brake magnets have the characteristic that as the plunger on which the shoe is located moves toward its fully energized position, it inherently reduces the air gap. As the air gap decreases, less and less current is required to produce a given force. Thus a basic instability exists, i.e. regardless of how slowly the current rises, a point is reached where the reduced air gap causes increased force which further reduces the air gap, and the brake moves rapidly to the fully released position.

By very careful design of the brake magnet, generally by having "steps" of increasing diameter on the plunger, it is possible to overcome this instability. Such a brake has a smooth curve, not necessarily straight, relating brake current to brake plunger travel. The inherent inductance of the brake coil forces the current to rise relatively slowly, and thus the brake lifts smoothly.

SUMMARY OF THE INVENTION

The purpose of this invention is to accomplish electronically what was previously obtained by the special mechanical design of the brake plunger. This purpose is achieved by controlling the current activating the brake magnet, or any other electro-magnetic solenoid, so that the solenoid is applied at a constant rate.

While the relationship between brake current and plunger travel has an inherent discontinuity, the relationship between magnetic flux and plunger travel does not have any such discontinuity. While this relationship is not linear, it does not matter because smooth application of the brake can still be accomplished by controlling the flux of the solenoid in a feedback circuit. Although it is not convenient to directly measure the magnetic flux in a magnet for this purpose, it is very easy to accurately measure the rate of change of magnetic flux and to integrate this signal to arrive at a flux signal. This is done by adding a second winding to the brake coil. This extra winding can consist of a relatively few turns of very fine wire that occupy very much less space than the main winding. This extra winding will be referred to as the "sensing" winding.

The voltage induced into this sensing winding, and measureable at its terminals, is precisely proportional to the rate of change of magnetic flux in the main winding forming the electro-magnet. Thus, if the brake coil is energized in such a way that the voltage in the sensing winding is constant, smooth operation must occur. To accomplish this it is necessary that a variable voltage be applied to the magnet coil.

It is very efficient to employ a static switching device, such as a power transistor, to control the brake energization. Then, smooth operation can be obtained by controlling the switching on and off of the transistor, which is connected in series with the brake coil, in accordance with the voltage induced in the sensing winding. The result is the same as that achieved for a variable voltage supply.

The switching transistor commonly used to control the brake current of elevator brake coils normally is turned fully on until the brake current reaches the desired level, and then switches on and off with the dwell ratio automatically adjusted to hold the current at the desired level in spite of changes in temperature, coil resistance and line voltage. This same transistor could be used to achieve the smooth brake release of this invention.

BRIEF DESCRIPTION OF THE DRAWINGS

The foregoing and other features of the present invention will be more readily apparent from the following detailed description and drawings of illustrative embodiments of the invention in which.

DESCRIPTION OF ILLUSTRATIVE EMBODIMENTS

Figure 1:
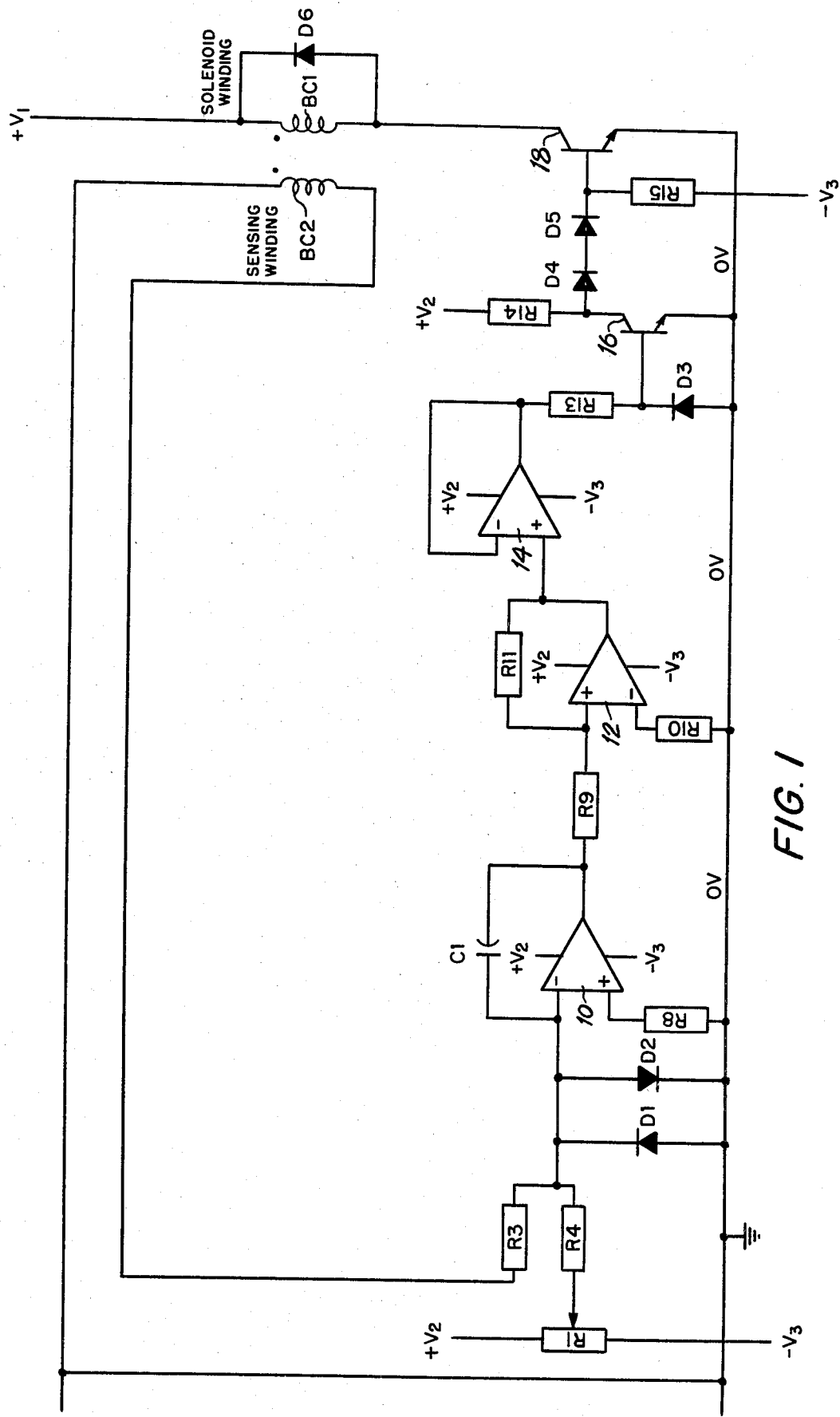
FIG. 1 shows a circuit which illustrates the basic principles for the control of the magnetic flux in an electro-magnet.

In FIG. 1 there is shown an electro-magnet with a primary winding BC1 and a sensing winding BC2. The primary winding BC1 is energized by current flowing through winding BC1 and power transistor 18 from a suitable D.C. power supply level $+V_1$ to a level OV. A diode D6 is connected across winding BC1 to provide a path for the inductive current to decay into when the transistor 18 turns off.

Transistor 18 can be switched on or off in accordance with the output of operational amplifier 12 via an amplifier comprised of operational amplifier 14, resistors R13, R14, and R15, diodes D3, D4 and D5, and transistor 16. Power for this amplifier, and for the remainder of the circuit of FIG. 1 is obtained from a DC power supply which provides a positive voltage $+V_2$ and a negative voltage $-V_3$ at a suitable level, such as plus and minus 5 volts, respectively, with respect to level OV, which is preferably at ground potential.

Operational amplifier 12 is operated as a toggle device so that its output has only two states; one state is positive with respect to level OV and the other state is negative. When the output of operational amplifier 12 is positive, transistor 18 is turned off because the output of operational amplifier 14 is also positive and current through resistor R13 flows into the base of transistor 16 to turn it on. When transistor 16 is turned on, transistor 18 is turned off because its base is held slightly negative due to the forward drop in voltage across diodes D4 and D5 from current flowing through resistor R15.

When the output of operational amplifier 12 is negative, transistor 18 is turned on because the output of operational amplifier 14 is also negative and this turns transistor 16 off. When transistor 16 is off, current flows from $+V_2$ through resistor R14 and through diodes D4 and D5 into the base of transistor 18, which causes it to turn on.

An understanding of the remainder of FIG. 1 can best be obtained by first assuming that potentiometer R1 has its slider exactly in the middle so that it is at the same potential as line OV. Also, it is assumed that the current through winding BC1 is at some intermediate level, neither zero nor maximum. Under these conditions, the circuit oscillates at a frequency determined by capacitor C1, resistor R3, voltage $+V_1$ and the turns ratio between the solenoid winding BC1 and the sensing coil BC2. For satisfactory operation, this frequency must be high enough to achieve substantially steady current in winding BC1, with the alternating component relatively small. The inductance of the electro-magnet coil, of course, has the effect of smoothing out the current in spite of the very high alternating component in the voltage across the coil. Generally, for typical magnets, a very wide range of frequencies is acceptable.

This oscillation can be explained by starting with the condition where transistor 18 is turned on. Then current is increasing in winding BC1 and a negative voltge is induced in sensing winding BC2. This voltage is applied to an integrator comprised of operational amplifier 10, resistors R3 and R8, and capacitor C1. Diodes D1 and D2 are for protection only and do not affect the normal operation of this integrator. The output of this integrator swings in a positive direction at a rate proportional to its input voltage, and when it reaches a predetermined positive voltage, as determined by resistors R9 and R11, the output of operational amplifier 12 toggles abruptly to its positive state. This causes transistor 18 to turn off, as described earlier.

When transistor 18 turns off, the current in winding BC1 decays through diode D6, and the voltage induced in winding BC2 changes to positive. This causes the output of the integrator to swing in a negative direction at a rate proportional to its input voltage, which is the voltage induced in sensing winding BC2. When the output of the integrator reaches a predetermined negative voltage, again determined by resistors R9 and R11, the output of operational amplifier 12 toggles abruptly to its negative state. This turns transistor 18 on again, and thus one complete cycle of the oscillation has occurred. Further similar cycles occur in repetition.

Since the voltage induced in sensing winding BC2 is proportional to the rate of change of flux in the electro-magnet, the integration of this voltage results in a measurement of the actual change in flux. Each time transistor 18 turns on, the flux rises in the electro-magnet by a small, but specific amount. Each time transistor 18 turns off, the flux drops by an identical amount. Thus, on the average, the flux remains constant.

The preceeding description was based on the assumption that potentiometer R1 had its slider at the same potential as OV. If it is assumed that the slider is moved toward voltage $+V_2$ so as to put a positive voltage on resistor R4, the output of the integrator will be biased so that it tends to swing faster in the negative direction and slower in the positive direction. This causes the increase in flux, when transistor 18 is turned on, to be greater than the decrease in flux when transistor 18 is turned off. This is perhaps easier to understand by stating that the off time of transistor 18 will be shortened and the on time lengthened by the bias applied to the integrator. The result of this biasing of the integrator is that the flux is increased at each cycle of the oscillation by an amount proportional to the positive voltage on the slider of potentiometer R1. By similar reasoning, a negative voltage on the slider of potentiometer R1 causes the flux to be decreased at each cycle by an amount proportional to this negative voltage.

There is, of course, a limit as to how quickly the flux can be reduced. If too high a rate is demanded, transistor 18 will turn off completely, and the rate of decay will be determined by the L/R ratio of the electromagnet and winding BC1. There is, however, no limit as to how slowly the flux can be reduced. Similarly, there is a limit as to how quickly the flux can be increased because if too high a rate is demanded, transistor 18 turns on continuously; but, no corresponding limit on how slowly the flux can be increased, exists.

Figure 2:
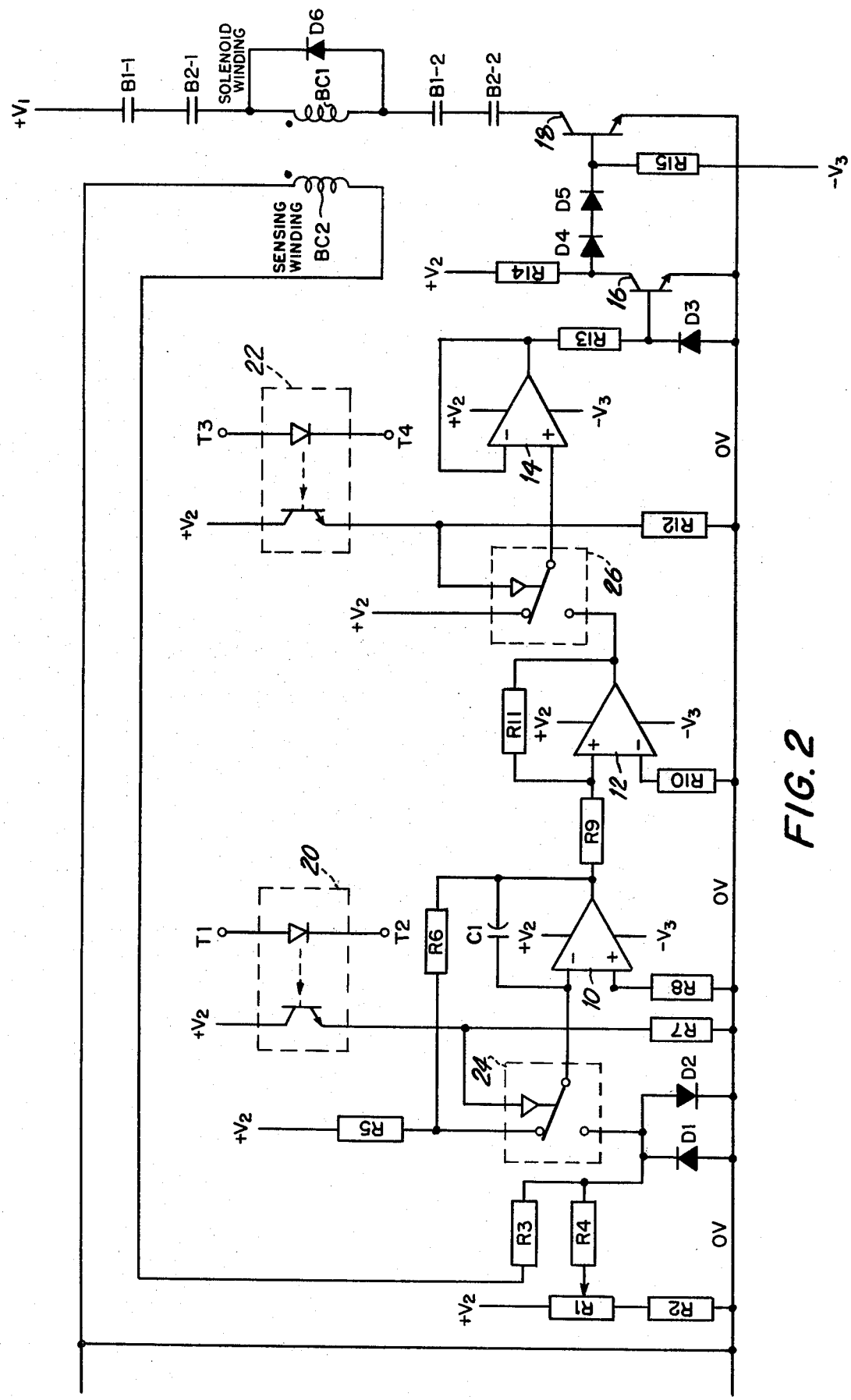
FIG. 2 shows a circuit in which the release of an elevator brake is controlled by this principle.

FIG. 2 contains all of the components of FIG. 1, but additions have been made to make it suitable for controlling the energization of an elevator brake coil in order to achieve a smooth release of the brake.

Brake contactors B1 and B2 are required to deenergize the brake coil for emergency stops. Contacts B1-1, B1-2, B2-1 and B2-2 are shown in series with the brake winding BC1. These contacts would be all closed to run, and open for an emergency stop and perhaps also at every normal stop, if desired.

Optical coupler 22, analogue switch 26 and resistor R12 have been added to the circuit of FIG. 2 to provide a means of turning transistor 18 off to de-energize the brake coil. Optical coupler 20, analogue switch 24, and resistors R5, R6 and R7 have been added to bypass the flux control feature for the initial part of the energization in order to get a faster brake release. Further, potentiometer R1 has been connected to level 0V through resistor R2 to give a suitable range of adjustment for positive voltages only, since this circuit only controls the flux when it is increasing.

When the elevator brake is not being energized, the two optical couplers have no current flowing through their light-emitting diodes, and both photo-transistors are turned off. Resistor R12 thus holds the control input of analog switch 26 at ground potential, and the internal solid state connection is as depicted by the mechanically equivalent blade of a toggle switch. This puts positive voltage from line $+V_2$ into the input of operational amplifier 14 and this turns transistor 18 off. Similarly, resistor R7 holds the control input of analogue switch 24 at ground potential, and this connects resistors R5 and R6 into the integrator circuit to force the integrator output to a negative value sufficient to make the output of operational amplifier 12 toggle to the negative condition.

When the brake is required to lift, the contactors B1 and B2 are energized, and current is applied through terminals T3 and T4 of optical coupler 22 by circuits not shown in FIG. 2. The illumination of the light emitting diode in circuit 22 causes the photo-transistor to turn on. This applies a positive voltage to the control input of switch 26 which causes its internal solid state connection to switch to the alternate input, which is connected to the output of operational amplifier 12. Since the output of amplifier 12 is presently negative, transistor 18 turns on, and brake current starts to flow. The control of flux, however, is not yet in effect.

After the brake current has risen to a predetermined value, as determined by circuits not shown in FIG. 2, current is supplied to terminals T1 and T2 of optical coupler 20. This causes analogue switch 24 to connect the input of the integrator into the feedback circuit for sensing winding BC2 so that the further increase of flux proceeds at a rate determined by the setting of potentiometer R1.

For general industrial use, the delay of the start of flux control may not be required. For elevator brake control, however, this delay is desirable so that the brake current rises initially as fast as possible to minimize delays in starting. The flux control delay, however, cannot be too great because the current sensing means must cause the switch to flux control to occur before the previously described magnet instability occurs. Without this flux control delay feature, there may be too much time delay between the initial energization of the brake and the start of brake plunger movement.

Although the example of FIG. 2 is particularly useful for elevator brake release, the invention is in no way limited to elevator brakes, and is equally applicable to the control of the rate of activation or release of any direct current electro-magnet.

I claim:

1. A control for the activation or deactivation of an electro-magnetic device having a primary operating winding, comprising:
    a first switching means for controlling the flow of current through the primary winding of the device,
    a sensing winding, magnetically coupled to said primary winding, in which a voltage related to the rate of change of flux in said primary winding is induced,
    control means for controlling the switching of said first switching means in response to a predetermined change in flux;
    means coupled to receive said induced voltage for producing a change of flux signal and for supplying said signal to said control means; and
    biasing means for altering said signal for producing a change of the average flux level in said electromagnetic device at a controlled, predetermined rate.

2. A control as claimed in claim 1 wherein said switching means is a solid state device.

3. A control as claimed in claim 2 wherein the solid state device is a transistor.

4. A control as claimed in claim 1, wherein said means for producing a change of flux signal comprises an integrator means for integrating the voltage induced in said sensing winding, wherein said integrator means is an operational amplifier with a capacitive feedback from its output to an inverting input, the voltage induced in said sensing winding being applied to said inverting input, and wherein said biasing means comprises means for applying a bias voltage to said inverting input along with said induced voltage for producing a uniform rate of change of the flux in said primary coil, said bias voltage determining the rate of change of the flux in said primary coil.

5. A control as claimed in claim 4 wherein said control means comprises:
    a level detector for determining the level of the integrated voltage, said detector switching states when that level exceeds a predetermined value, said level detector producing different output voltage levels when in different states, and
    an amplifier for amplifying the output voltage levels of said level detector and driving said switching means in response thereto.

6. A control as claimed in claim 4, further including a second switching means for rendering said integrator means inoperative, wherein said second switching means can be coupled to be actuated only after the flux in said primary winding has reached a predetermined value so as to delay the operation of said control means.

7. A control as claimed in claim 6 further including a third switching means for rendering said control means inoperative in such a manner that said first switching means does not permit current to flow through said primary winding.

8. A control as claimed in claim 7 wherein said second and third switching means comprise analog switches under the control of optical couplers.

9. A control as claimed in claim 1 or 7 wherein said electro-magnetic device is a D.C. solenoid controlling a plunger of a brake for an elevator, which plunger is spring-bias toward application of the brake, said control being arranged to achieve a smooth energization of said solenoid and a smooth release of said brake.

* * * * *